(12) United States Patent
Sano

(10) Patent No.: US 9,467,152 B2
(45) Date of Patent: Oct. 11, 2016

(54) OUTPUT CIRCUIT

(71) Applicant: SOCIONEXT INC., Yokohama-shi, Kanagawa (JP)

(72) Inventor: Hiroyuki Sano, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/745,029

(22) Filed: Jun. 19, 2015

(65) Prior Publication Data

US 2016/0013798 A1 Jan. 14, 2016

(30) Foreign Application Priority Data

Jul. 9, 2014 (JP) .................................. 2014-141575

(51) Int. Cl.
| | | |
|---|---|---|
| *H03L 7/06* | (2006.01) | |
| *H03L 7/081* | (2006.01) | |
| *G06F 1/04* | (2006.01) | |

(52) U.S. Cl.
CPC ............... *H03L 7/0812* (2013.01); *G06F 1/04* (2013.01)

(58) Field of Classification Search
None
See application file for complete search history.

(56) References Cited

U.S. PATENT DOCUMENTS

| | | | | |
|---|---|---|---|---|
| 8,169,348 | B2 * | 5/2012 | Tsunoda | ................... H03M 9/00 341/101 |
| 2007/0025453 | A1 * | 2/2007 | Terashima | .............. H04L 25/14 375/257 |
| 2010/0141306 | A1 * | 6/2010 | Doi | ........................ H03M 9/00 327/117 |
| 2011/0285443 | A1 * | 11/2011 | Suzawa | ............ G01R 31/31919 327/199 |

FOREIGN PATENT DOCUMENTS

| | | |
|---|---|---|
| JP | 11-177540 A | 7/1999 |
| JP | 2000-022677 A | 1/2000 |

* cited by examiner

*Primary Examiner* — Long Nguyen
(74) *Attorney, Agent, or Firm* — Arent Fox LLP

(57) ABSTRACT

An output circuit includes: an output portion which includes a plurality of output blocks each of which converts 2-bits parallel data to 1-bit serial data and outputs the converted serial data; a control signal generation circuit; a first clock generation portion; and a plurality of second clock generation portions which individually generate second clocks, wherein each of the output blocks includes: a latency expansion circuit which sequentially latches the 2-bits parallel data according to the reference clock and an inverted reference clock, selects two from the latched data signals based on the latency adjustment signal; and two-clocks flip-flop circuit which latches one of two outputs from the latency expansion circuit in synchronization with the second clock corresponding to the output block and latches the other of the two outputs from the latency expansion circuit in synchronization with the inverted second clock.

16 Claims, 18 Drawing Sheets

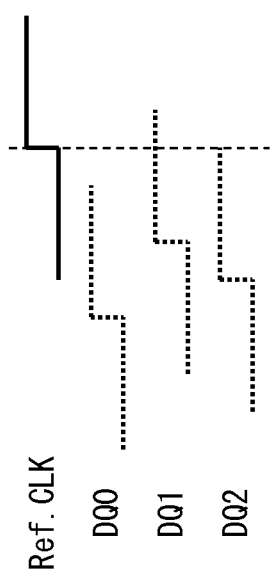
FIG. 2A
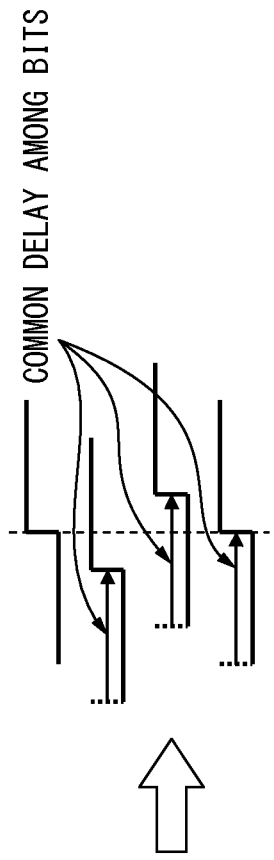
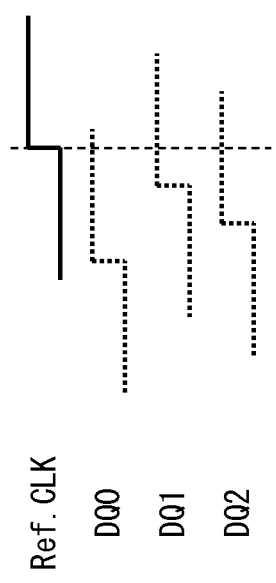
FIG. 2B
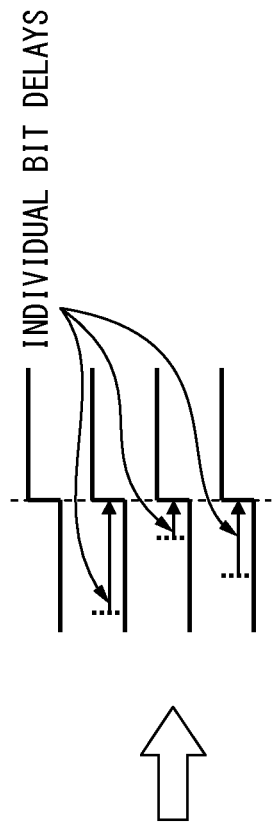

| Input | | | | Output |
|---|---|---|---|---|
| CLK0 | CLK1 | DATA0 | DATA1 | Q |
| Up | H or L | L | — | L |
| Up | H or L | H | — | H |
| Down | H or L | — | — | Hold |
| H or L | Up | — | L | L |
| H or L | Up | — | H | H |
| H or L | Down | — | — | Hold |

FIG. 12

| ISFT[7:0] | ISELA | NDQ0_S | NDQ1_S | PHASE |
|---|---|---|---|---|
| 00010000<br>00010001<br>00010010<br>00010011<br>⋮<br>01001101<br>01001110<br>01001111 | 0 | NDQ01_R | NDQ12_R | 45.0000deg.<br>47.8125deg.<br>50.6250deg.<br>53.4375deg.<br>⋮<br>216.5625deg.<br>219.3750deg.<br>222.1875deg. |
| 01010000<br>01010001<br>01010010<br>01010011<br>⋮<br>10001101<br>10001110<br>10001111 | 1 | NDQ02_R | NDQ13_R | 225.0000deg.<br>227.8125deg.<br>230.6250deg.<br>233.4375deg.<br>⋮<br>396.5625deg.<br>399.3750deg.<br>402.1875deg. |

FIG. 16

| CONDITION No. | DLLA+DLLZ PHASE | ISELA | ISELB | NDQ0_S | NDQ1_S |
|---|---|---|---|---|---|
| 1 | 45deg. ~225deg. | 0 | 0 | NDQ01_R | NDQ13_R |
| 2 | 225deg. ~315deg. | 0 | 1 | NDQ02_R | NDQ14_R |
| 3 | 45deg. ~225deg. | 1 | 0 | NDQ12_R | NDQ02_R |
| 4 | 225deg. ~315deg. | 1 | 1 | NDQ13_R | NDQ03_R |

OUTPUT CIRCUIT

CROSS-REFERENCE TO RELATED APPLICATION

This application is based upon and claims the benefit of priority of the prior Japanese Patent Application No. 2014-141575, filed on Jul. 9, 2014, the entire contents of which are incorporated herein by reference.

FIELD

The present invention relates to an output circuit.

BACKGROUND

In recent years, transmission speeds in interfaces increase, and a bit rate of data transmission and reception has become several Gbps (bits/second). As operation speeds of memory devices such as a DDR-SDRAM (Double Date Rate-Synchronous Dynamic Random Access Memory) have also been increased, a speed of the interface between a main circuit and the DDR-SDRAM is desired to be increased. For example, in an interface with respect to a DDR-SDRAM of which input and output operations are carried out at 2.133 Gbps, a transmission clock is 1.066 GHz since the DDR-SDRAM operates at a double data rate. However, the input and output operations are controlled by a clock of 2.133 GHz. Further, there may be an interface in which data signals of a plurality of bits are transmitted in parallel in order to increase a data rate of the interface. In such interface, a phase adjustment unit (De-Skew Unit) which cancels timing skews among data outputs of the plurality of bits is provided to adjust phases of data outputs. The embodiments relate to output circuits in which phases of data outputs are adjusted by a transmission clock.

An internal circuit operates at low speed since it is difficult to operate at high-speed. An output circuit converts parallel data of a plurality of bits to serial data of high-speed. As described above, when the interface in which data signals of a plurality of bits are transmitted in parallel is used, the output circuit includes a plurality of output blocks, in each of which N-bits (N: power of 2) parallel data is converted to 1-bit serial data. For example, when a number of output blocks is M, data signals of M-bits are transmitted in parallel. Skews among outputs of M-bits parallel data are adjusted to zero. In the adjustment of the skews, adjustment values cancelling the skews are previously measured in a training mode, and the adjustment values are stored. In normal operations, the skews are adjusted based on the stored adjustment values. Hereinafter, a plurality of output blocks for transmitting M-bits parallel data are referred as "output blocks of M-bits".

When the transmission speed increases as described above, skews among signals of parallel data output from the internal circuit to the output circuits and skews in signal paths from the output circuits to output terminals relatively become so large as not to be neglected. When N-bits parallel data is converted to 1-bit serial data in each of the output blocks of M-bits, 2-bits parallel data is converted to 1-bit serial data at a last stage of each output block. Stages except the last stage are circuits which operate at a frequency of the transmission clock or frequencies of clocks less than ½ thereof, and therefore, operational margins of such circuits are comparatively large. However, the last stage is a circuit which operates at a double frequency of the transmission clock. Therefore, since the phase adjustment unit in the last stage operates at a clock of high-speed frequency, consuming power of the circuit forming the last stage is large and an operational margin thereof is small.

Further, the phase adjustment units are formed by DLLs (Delay Locked Loops). Since a plurality of DLLs are respectively provided for the output circuits of M-bits, rising edges/falling edges of outputs of the DLLs do not coincide with each another.

RELATED DOCUMENTS

[Patent Document 1] Japanese Laid Open Patent Document No. 2000-022677
[Patent Document 2] Japanese Laid Open Patent Document No. H11-177540

SUMMARY

An output circuit according to a first aspect includes: an output portion which includes a plurality of output blocks each of which converts 2-bits parallel data to 1-bit serial data and outputs the converted serial data; a control signal generation circuit which generates a latency adjustment signal, a first phase adjustment signal and a plurality of second phase adjustment signals according to a reference clock; a first clock generation portion which generates a first clock according to the reference clock based on the first phase adjustment signal; and a plurality of second clock generation portions which individually generate second clocks in synchronization with the first clock and inverted second clocks, which are inverted of the second clocks, individually based on the plurality of second phase adjustment signals, wherein each of the output blocks includes: a latency expansion circuit which sequentially latches the 2-bits parallel data according to the reference clock and an inverted reference clock, which is inverted of the reference clock, selects two from the latched data signals based on the latency adjustment signal, and outputs the selected two; and two-clocks flip-flop circuit which is arranged with respect to the latency expansion circuit, which latches one of two outputs from the latency expansion circuit in synchronization with the second clock corresponding to the output block and holds the output for a half of a cycle of the second clock, and which latches the other of the two outputs from the latency expansion circuit in synchronization with the inverted second clock corresponding to the output block and holds the output for a half of a cycle of the inverted second clock.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIGS. 2A and 2B are diagrams explaining the skew adjustment;

FIG. 12 is a diagram illustrating a truth table of ISFT[7:0] and the latency adjustment signal ISELA used in the output circuit of the first embodiment;

FIG. 16 is a diagram illustrating a truth table representing relationships of the latency control signal corresponding to phase ranges and the selected signal;

DESCRIPTION OF EMBODIMENTS

Before explaining output circuits of the embodiments, a general example of an output circuit which includes output blocks of M-bits in each of which N-bits parallel data is converted to 1-bit serial data and adjusts skews among data outputs of M-bits to zero.

Figure 1:
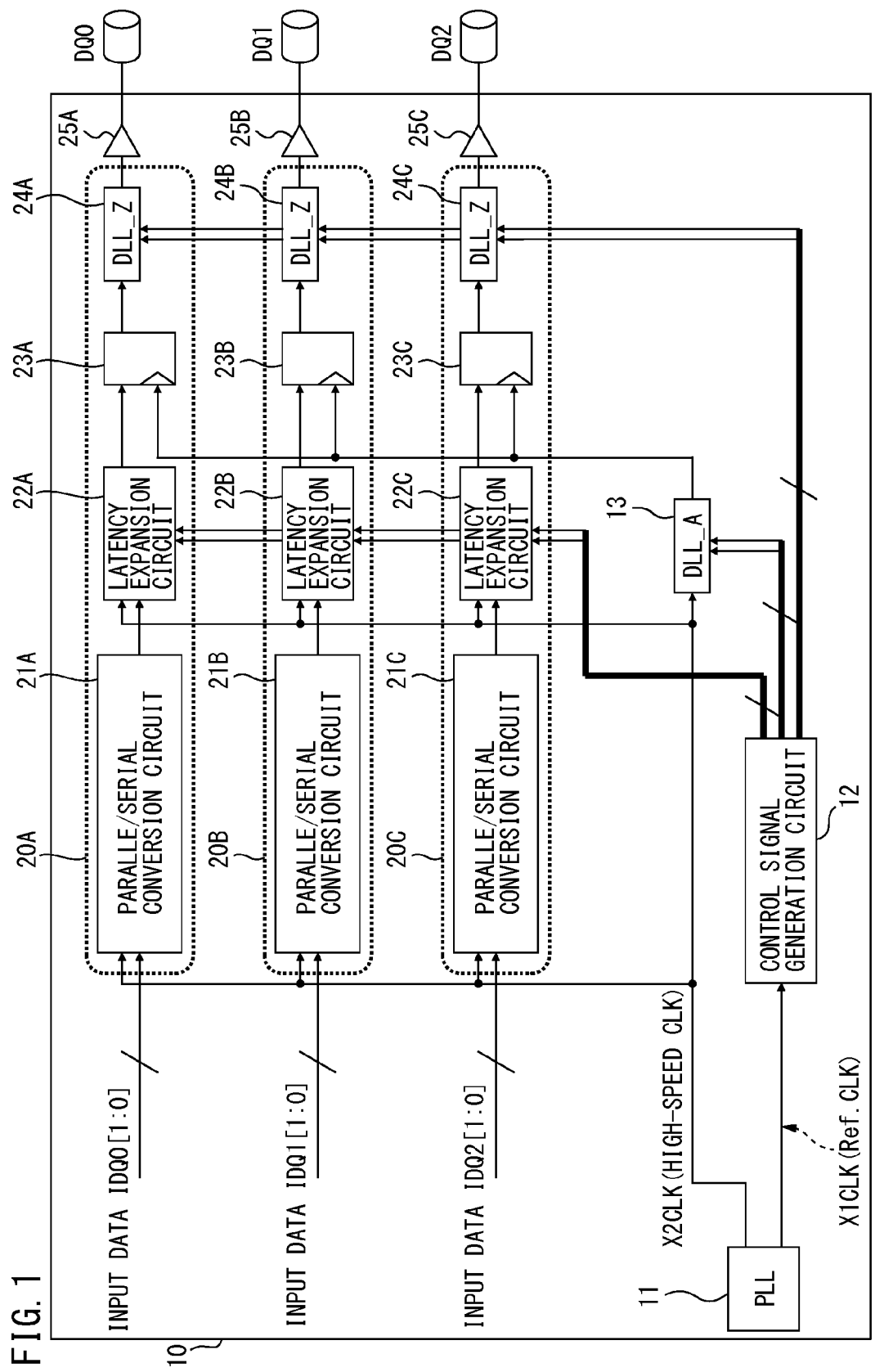
FIG. 1 is a diagram illustrating a configuration of a general output circuit which includes output blocks of M-bits in each of which N-bits parallel data is converted to 1-bit serial data and adjusts skews among data outputs of M-bits to zero.

FIG. 1 is a diagram illustrating a configuration of a general output circuit which includes output blocks of M-bits in each of which N-bits parallel data is converted to 1-bit serial data and adjusts skews among data outputs of M-bits to zero. FIG. 1 illustrates a portion in which 2-bits parallel data is converted to 1-bit serial data after N-bits parallel data is converted to the 2-bits parallel data in each of the output blocks of M-bits. FIG. 1 illustrates an example of M=3. The operations to convert N-bits parallel data to 2-bits parallel data in each of the output blocks of M-bits are carried out in circuits operating at clocks of which frequency is same as a transmission clock or less than ½ thereof. Therefore, circuitry operational margins of these circuits are comparatively large and there occurs no problem regarding the operational margins. Accordingly, the portion in which 2-bits parallel data is converted to 1-bit serial data in each of the output blocks of M-bits will be described here. In each of the output blocks of M-bits, the output circuit illustrated in FIG. 1 converts 2-bits parallel data to 1-bit serial data and outputs the converted 1-bit serial data at a DDR (Double Data Rate) in synchronization with the transmission clock.

The output circuit includes: a PLL (Phase Locked Loop) 11; a control signal generation circuit 12; a DLL (Delay Locked Loop)_A 13; three bit-slice circuits 20A-20C; and output buffers 25A-25C. PLL 11 generates a reference clock X1CLK (Ref.CLK) having a frequency same as that of the transmission clock and a double frequency clock X2CLK (high-speed CLK) having a double frequency as that of the transmission clock. The control signal generation circuit 12 generates a latency adjustment signal and a phase adjustment signal, which are described below, from Ref.CLK. DLL_A 13 delays the high-speed CLK by a delay value common to the three bit-slice circuits 20A-20C.

The three bit-slice circuits 20A-20C includes: parallel-to-serial (parallel/serial) conversion circuits 21A-21C; latency expansion circuits 22A-22C; latch (Flip-Flop) circuits 23A-23C; and DLL_Zs 24A-24C. The parallel/serial conversion circuits 21A-21C convert the 2-bits parallel data IDQ0[1:0], IDQ1[1:0] and IDQ2[1:0] to 1-bit serial data in synchronization with the high-speed CLK. As described above, data is output at DDR, and the data changes at rising and falling edges. Therefore, when Flip-Flops (Hereinafter, referred as FFs) operating in synchronization with the rising edge of a clock are used to form the output circuit, the high-speed CLK having a double frequency of Ref.CLK is supplied to the FFs.

IDQ0[1:0], IDQ1[1:0] and IDQ2[1:0] have some phase differences (skews) each another due to arrangements of signal paths. In the high-speed circuits of the final stages, these skews become problems. Therefore, the latency expansion circuits 22A-22C adjust the skews among IDQ0[1:0], IDQ1[1:0] and IDQ2[1:0]. In the following, the adjustments of skews will be explained. The explanation is made under assumption that the skews are less than 1 cycle of Ref.CLK. However, this technique is not limited to such condition. Since a latency expansion circuit used in a condition that the skews are larger than 1 cycle of Ref.CLK was known, explanations regarding such condition are omitted.

FIGS. 2A and 2B are diagrams explaining skew adjustment operations. FIG. 2A explains adjustment operations of skews common to three signals of 3-bits data in the latency expansion circuit. FIG. 2B explains adjustment operations of individual skews of three signals of 3-bits data.

As illustrated in FIG. 2A, three signals of 3-bits data DQ0, DQ1 and DQ2 output from the parallel/serial conversion circuits 21A-21C respectively have skews with respect to Ref.CLK. A delay common among three signals of 3-bits data is previously measured in a training mode. Hereinafter, the delay common among three signals of 3-bits data is referred as "common delay" or "common delay among bits". When the three signals of 3-bits data DQ0, DQ1 and DQ2 are shifted by the common delay, the rising edge of Ref.CLK positions at a center of a range between the most latest edge and the most advanced edge of three edges of the shifted DQ0, DQ1 and DQ2. The control signal generation circuit 12 stores the common delay. The stored common delay is used as a latency adjustment signal for adjusting the delay common among three data signals of 3-bits. The stored common delay is also used as a first phase adjustment signal which is supplied to FFs 23A-23C and used for phase adjustments of the clock.

However, after the skew adjustment illustrated in FIG. 2A is carried out, skews of the shifted DQ0, DQ1 and DQ2 with respect to Ref.CLK are still remained. Hereinafter, the remaining skews with respect to Ref.CLK after the common delay is adjusted are referred as "individual bit skews" or "individual skews for bits". Accordingly, as illustrated in FIG. 2B, individual bit delays of DQ0, DQ1 and DQ2 with respect to Ref.CLK, which correspond to the individual bit skews, are further measured in the training mode. When DQ0, DQ1 and DQ2 are respectively shifted by the individual bit delays, rising edges of DQ0, DQ1 and DQ2 coincide with the rising edge of Ref.CLK. The control signal generation circuit 12 stores the individual bit delays as second phase adjustment signals.

In the training mode, most appropriate latency adjustment signal, most appropriate first phase adjustment signal and most appropriate second phase adjustment signal are obtained by sweeping a phase shift value which are combinations of the latency adjustment signal, the first phase adjustment signal and the second phase adjustment signals. The obtained most appropriate latency adjustment signal, most appropriate first phase adjustment signal and most appropriate second phase adjustment signal are stored in registers accompanying to the control signal generation circuit 12 as a latency adjustment signal, a first phase adjustment signal and a second phase adjustment signal.

In normal operations, the latency expansion circuits 22A-22C delay DQ0, DQ1 and DQ2 according to the latency adjustment signal from the control signal generation circuit 12. DLL_A 13 delays the high-speed CLK according to the first phase adjustment signal. The latch circuits 23A-23C latch DQ0, DQ1 and DQ2, of which latencies are adjusted, in synchronization with the high-speed CLK of which phase is adjusted according to the first phase adjustment signal. DLL_Zs 24A-24C respectively delay outputs from the latch circuits 23A-23C according to the second phase adjustment signals to generate signals of three 1-bit serial data of which phases coincide each another, and output the signals of three 1-bit serial data to the output buffers 25A-25C.

As described above, in the normal operations, the control signal generation circuit 12 outputs the stored latency adjustment signal, the stored first phase adjustment signal and the stored second phase adjustment signals to related portions, and signals of 3-bit data DQ0-DQ3 of which skews among them are reduced are output.

Figure 3:
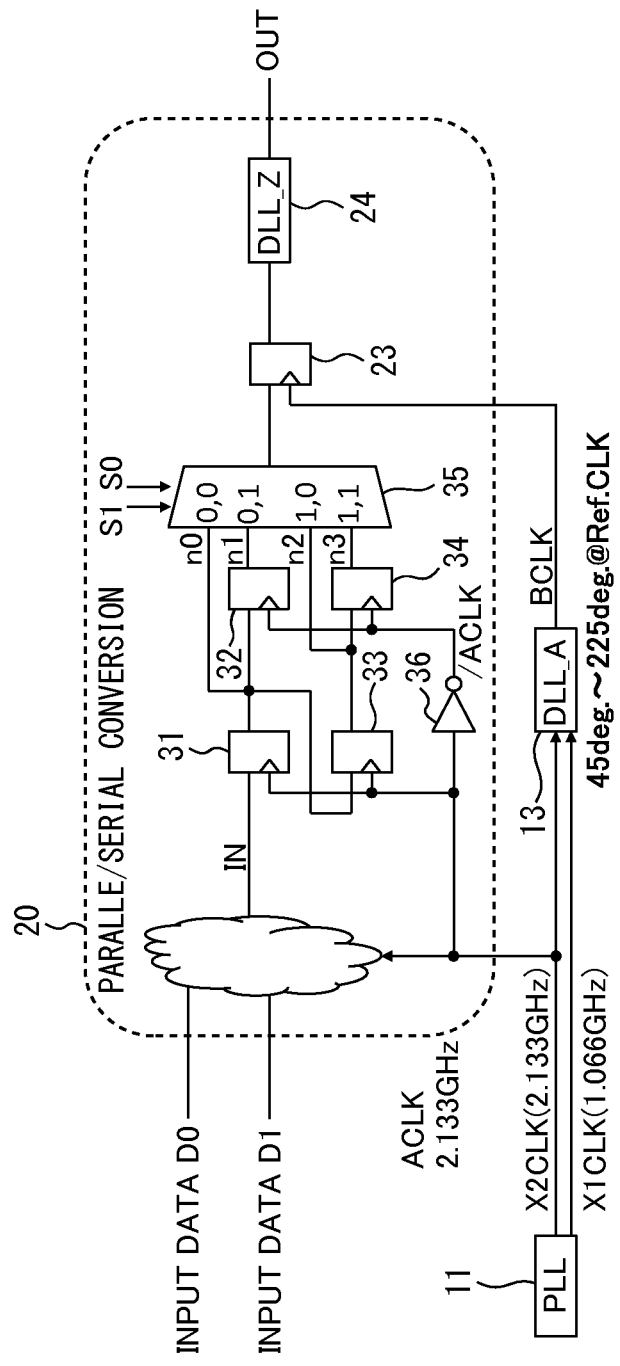
FIG. 3 is a diagram illustrating a circuit constitution of a bit-slice circuit for each bit, with PLL1 and DLL_A.

FIG. 3 is a diagram illustrating a circuit constitution of a bit-slice circuit 20 for each bit, with PLL1 and DLL_A 13.

Figure 4:
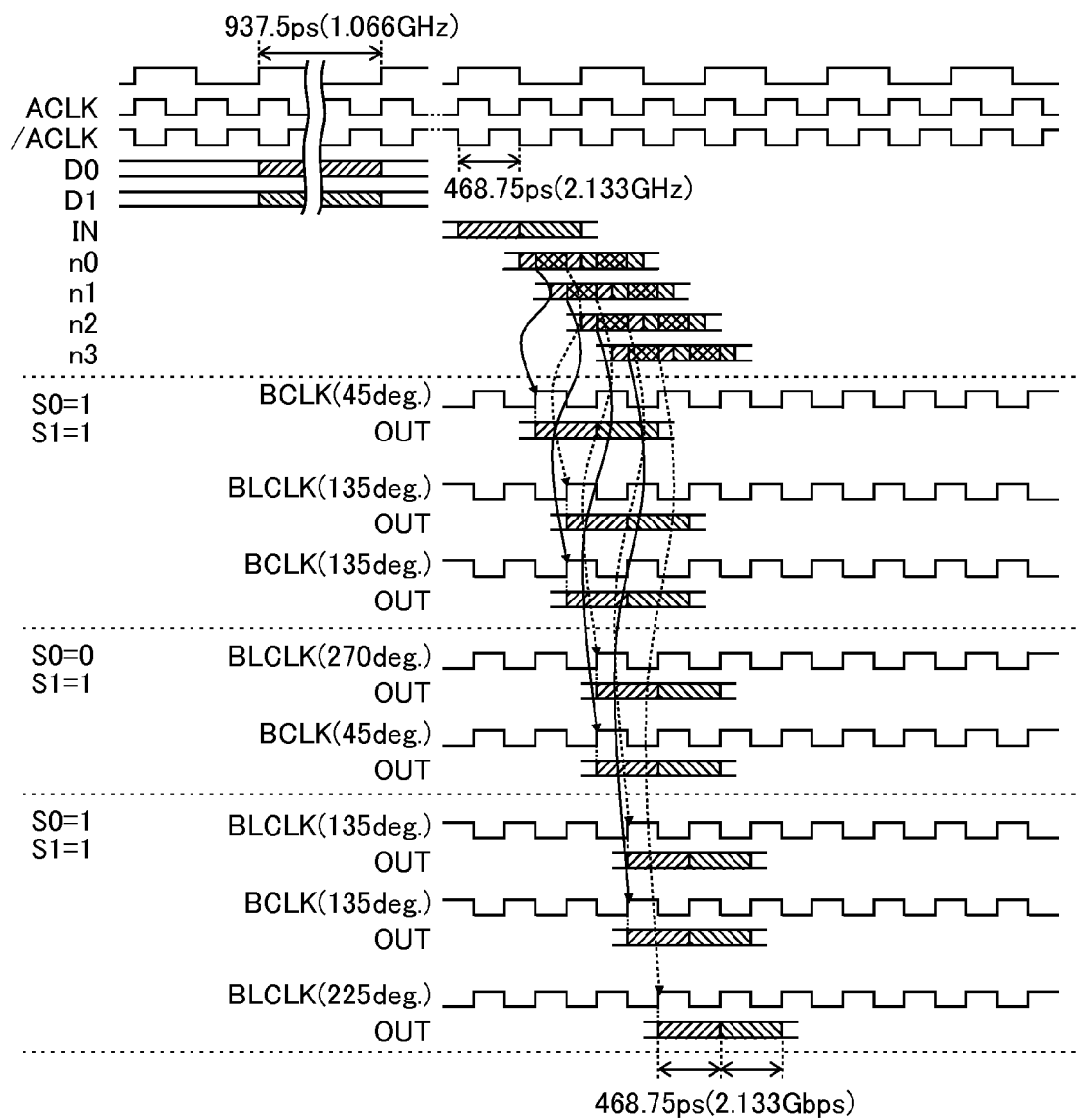
FIG. 4 is a time chart illustrating operations of the bit-slice circuit.

FIG. 4 is a time-chart illustrating operations of the bit-slice circuit 20.

FIGS. 3 and 4 illustrate a case in which the transmission clock and Ref.CLK (X1CLK) are 1.066 GHz, and the high-speed CLK (X2CLK) is 2.133 GHz. Accordingly, output signals are output at DDR of 1.066 GHz, and the output signals change at clock cycle of 2.133 GHz.

Latch circuits (FFs: Flip-Flops) 31-34 and a selection circuit (selector) 35 in the bit-slice circuit 20 in FIG. 3 form the latency expansion circuit 22. In FIG. 3, the parallel/serial conversion circuit is omitted to be illustrated. Further, input data D0 and D1 are input as 2-bits parallel data.

As illustrated in FIGS. 3 and 4, PLL 1 generates X1CLK (1.066 GHz) and X2CLK (2.133 GHz). In FIGS. 3 and 4, X2CLK (high-speed CLK) is also represented as ACLK (2.133 GHz), and an inverted signal of ACLK is represented as /ACLK. DLL includes DLL_A 13, which carries out the phase adjustment common among data signals of 3-bits, and DLL_Z 24, which carries out the phase adjustment of individual 1-bit data.

As illustrated in FIG. 4, input data D0, D1 of the 2-bits parallel data are converted to serial data IN in the parallel/serial conversion circuit, which is not illustrated in FIG. 3.

Serial data IN is latched by four FFs 31-34 in synchronization with ACLK and /ACLK which are a positive phase clock and a negative phase clock of X2CLK. As illustrated in FIG. 3, FFs 31-34 are connected in serial/parallel. Outputs of FFs 31-34 are respectively represented as n0, n1, n2, n3. As illustrated in FIG. 4, n0-n3 are signals which are sequentially shifted by a half cycle of X2CLK.

By using DLL_A 13 common to three data signals of 3-bits, X2CLK is shifted by 45 degree to 225 degree and output as a phase adjusted clock BCLK. A value of phase shift is represented as a phase in X1CLK. For example, according to this representation, the above shift value is represented as 45 deg.-225 deg.@Ref.CLK.

The above-mentioned latency control signal is a 2-bits signal of S0 and S1. The selection circuit 35 selects and outputs one of n0-n3 according to S0 and S1. FF 23 latches an output from the selection circuit 35 in synchronization with the above-mentioned BCLK.

In a case in which X2CLK is shifted in a range of 45 deg.-135 deg.@Ref.CLK, FF 23 latches n0 when the selection circuit 35 selects n0, and FF 23 latches n2 when the selection circuit 35 selects n2. In a case in which X2CLK is shifted in a range of 135 deg.-225 deg. @Ref.CLK, FF 23 latches n1 when the selection circuit 35 selects n1, and FF 23 latches n3 when the selection circuit 35 selects n3.

Further, DLL_Z 24 shifts an output from FF 23 in a range 0 deg.-90 deg.@X1CLK. In other words, DLL_Zs 24A-24C adjust phases of outputs of 3-bits data, which are output from the output buffers 25A-25C, to coincide each another.

As described above, by the above-mentioned operations, phases are adjusted in a wide range, and skews among signals of a plurality of bits are adjusted. However, the above-mentioned circuit has the following problems.

(1) Since a control clock (high-speed clock) of 2.133 GHz is used to obtain outputs changing at a clock cycle of 2.133 GHz, high-speed operation circuits are used.

(2) The de-skew units (bit-slice circuits) have relatively small circuitry operational margins and large power consumption since the de-skew units (bit-slice circuits) operate by the high-speed clock.

(3) In the above output circuit, as illustrated in FIG. 1, since DLL_Zs 24A-24C are arranged at last stages of the bit-slice circuits 20A-20C, differences of rising/falling edges among DLL_Zs 24A-24C may easily occur. Further, a circuitry area of the bit-slice circuits 20A-20C becomes large.

In the embodiments described below, an output circuit of which power consumption is reduced and circuitry operational margins are increased will be disclosed.

An output circuit according to a first embodiment is an output circuit which includes output blocks of M-bits in each of which N-bits parallel data is converted to 1-bit serial data and skews among output data signals of M-bits to zero. The output circuit according to the embodiments has the following constitutions to solve the above-mentioned problems.

(1) In order to reduce power consumption and to obtain sufficient circuitry operational margins in de-skew units, a reference clock X1CLK having a same frequency as that of a transmission clock is used as a control clock. In other words, the high-speed clock X2CLK having a double frequency as that of a transmission clock is not used.

(2) In order to realize the above item (1), a latency expansion circuit and a phase adjustment circuit ("two-clocks flip-flop circuit (2CLK-FF)") which operate by X1CLK are newly used.

(3) DLL_Zs for individual bits are not respectively arranged at the bit-slice circuits but are arranged to neighbor each another on a clock path from DLL_A which is common for bits.

In the following, an output circuit of a first embodiment realizing the above items will be described.

Figure 5:
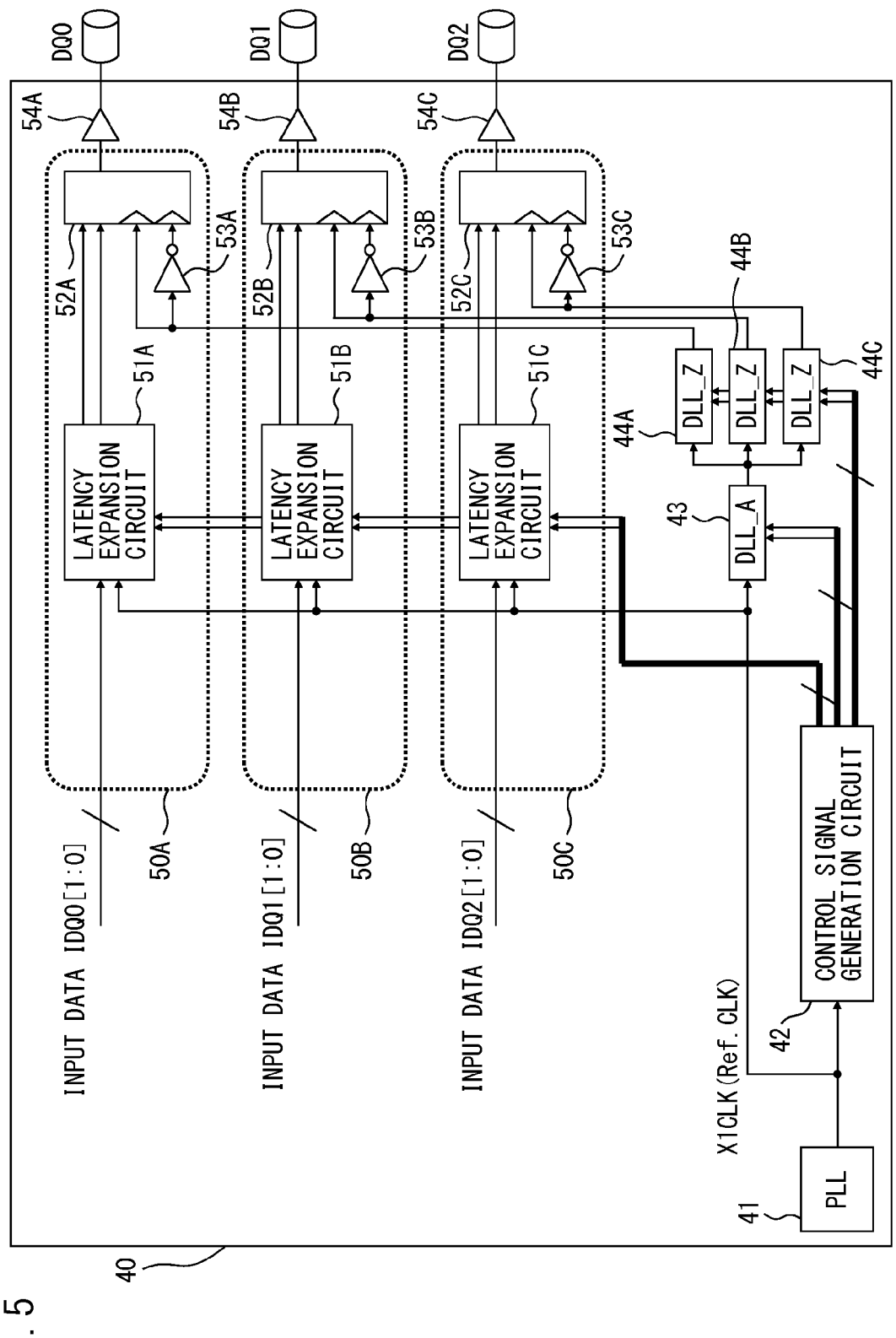
FIG. 5 is a diagram illustrating a constitution of last stages of an output circuit of the first embodiment in which 2-bits parallel data is converted to 1-bit serial data in each of output blocks of M-bits (M=3)

FIG. 5 is a diagram illustrating a constitution of last stages of an output circuit of the first embodiment in which 2-bits parallel data is converted to 1-bit serial data in each of output blocks of M-bits (here, M=3).

The output circuit of the first embodiment includes: PLL 41; a control signal generation circuit 42; DLL_A 43; three DLL_Zs 44A-44C; three bit-slice circuits 50A-50C; and output buffers 54A-54C.

PLL 41 generates a reference clock X1CLK (Ref.CLK) having a same frequency as that of a transmission clock. The control signal generation circuit 42 generates a latency adjustment signal and a phase adjustment signal from Ref. CLK. DLL_A 43 delays X1CLK by a common delay. DLL_Zs 44A-44C individually adjust the clocks output from DLL_A 43, which is adjusted by the common delay, by individual skews of respective bits.

The bit-slice circuits 50A-50C includes: latency expansion circuit 51A-51C; two-clocks flip-flop circuits (2CLK-FFs) 52A-52C; and inverters 53A-53C.

As described above, in the output circuit of the first embodiment, operations of latency expansion are carried out before the parallel/serial conversion, and 2CLK-FFs 52A-52C are used as FFs at last stages of the bit-slice circuits 50A-50C. As described later, 2CLK-FF latches two data inputs in synchronization with two kinds of CLKs having different phases, and outputs the latched data as serial data. In other words, 2CLK-FF carries out the parallel/serial conversion to convert 2-bits parallel data to 1-bit serial data. Further, phase adjustments are carried out by sweeping clocks input to 2CLK-FFs 52A-52C by using DLL_A 43 and DLL_Zs 44A-44C, and phase controls are carried out by inputting the phase adjusted clocks to 2CLK-FFs 52A-52C. Thus, 2CLK-FFs 52A-52C carry out the parallel/serial conversion and the phase adjustment adjusting individual skews among bits.

The latency expansion circuits 51A-51C are also controlled by X1CLK and inverted X1CLK which is inverted of X1CLK. As described above, the phase controls are carried out based on the phase adjustment values obtained by sweeping clocks input to 2CLK-FFs 52A-52C. Ranges for obtaining data signals by 2CLK-FFs 52A-52C are expanded by selecting the outputs of the latency expansion circuits 51A-51C according to the phase adjustment values.

DLL_Zs 44A-44C are not respectively arranged at last stages of the bit-slice circuits 50A-50C. DLL_Zs 44A-44C are arranged on paths of clocks input to 2CLK-FFs 52A-52C, concretely, near DLL_A 43 which is common to DLL_Zs 44A-44C so that DLL_Zs 44A-44C neighbor each another.

Figures 6A, 6B:
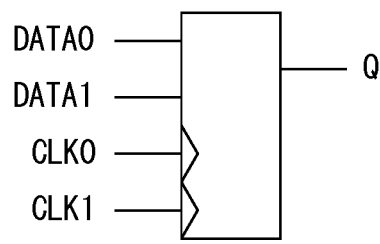
FIG. 6A is a diagram illustrating a symbol of 2CLK-FF.
FIG. 6B is a diagram illustrating a truth table of 2CLK-FF.

FIG. 6A is a diagram illustrating a symbol of 2CLK-FF.
FIG. 6B is a diagram illustrating a truth table of 2CLK-FF.

As illustrated in FIG. 6A, 2CLK-FF receives two input data signals DATA0 and DATA1 and two clocks CLK0 and CLK1, and output one data signal Q.

As illustrated in FIG. 6B, in a state in which CLK1 is high (H) or low (L), when CLK0 rises, 2CLK-FF latches DATA0 and outputs the latched DATA0 as Q. However, when CLK0 falls, Q does not change, namely, Q is retained. In a state in which CLK0 is high (H) or low (L), when CLK1 rises, 2CLK-FF latches DATA1 and outputs the latched DATA1 as Q. However, when CLK1 falls, Q does not change, namely, Q is retained. Accordingly, CLK0 and CLK1 which do not simultaneously rise (namely, rising edges of CLK0 and CLK1 are separated with a predetermined time) are input.

Figure 7:
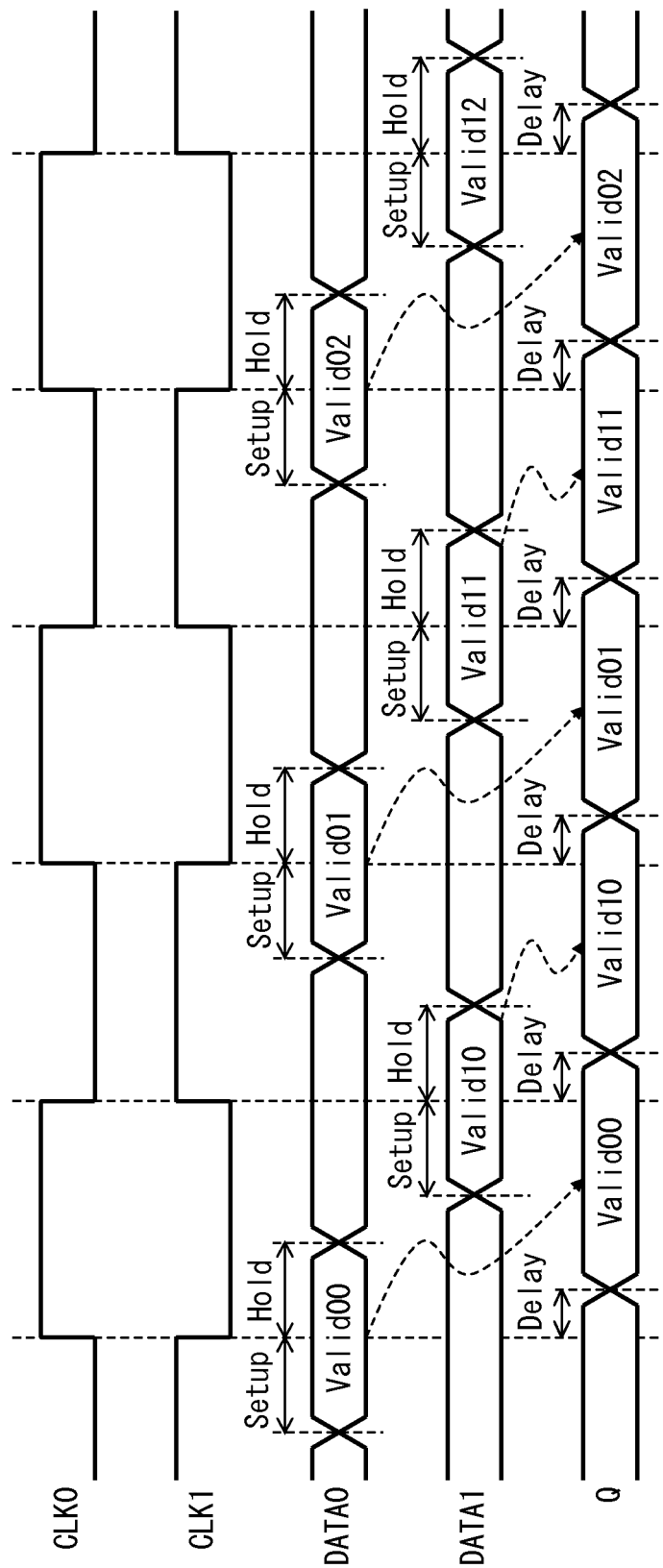
FIG. 7 is a time chart illustrating operations of 2CLK-FF.

FIG. 7 is a time chart illustrating operations of 2CLK-FF.

As illustrated in FIG. 5, in the first embodiment, the phase adjusted clock and the inverted clock thereof are input to 2CLK-FF as CLK0 and CLK1. FIG. 7 also illustrates an example in which a clock and an inverted clock thereof are input as CLK0 and CLK1.

DATA0 is required to be static for a predetermined setup time and a predetermined hold time with respect to a rising edge of CLK0, and the output Q changes to data Valid00 corresponding to DATA0 after a delay time from the rising edge of CLK0. Similarly, DATA1 is required to be static for the predetermined setup time and the predetermined hold time with respect to a rising edge of CLK1, and the output Q changes to data Valid10 corresponding to DATA1 after the delay time from the rising edge of CLK1. As described above, when CLK1 is inverted with respect to CLK0, Q alternately changes between DATA0 and DATA1 with a half cycle of the clock. In other words, 2-bits parallel data of DATA0 and DATA1 is converted to 1-bit serial data, and the 1-bit serial data is output.

Figure 8A:
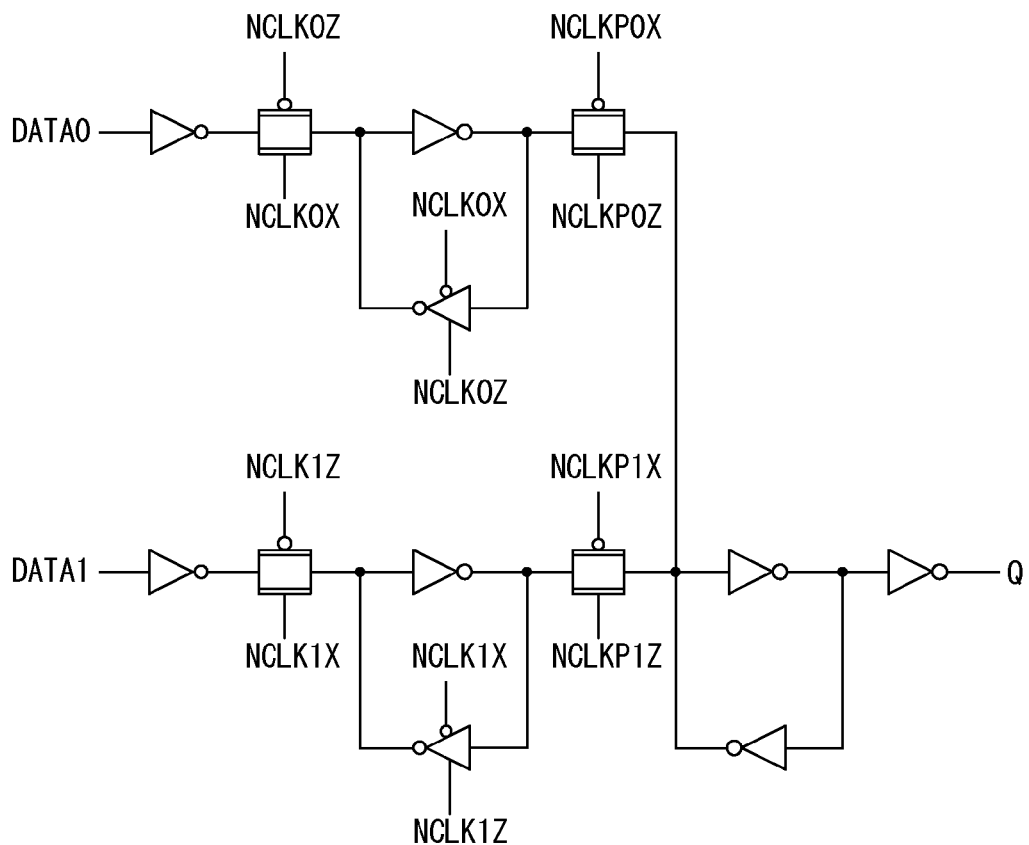
FIGS. 8A to 8C are diagrams illustrating concrete constitutional examples of 2CLK-FF.
Figure 8B:
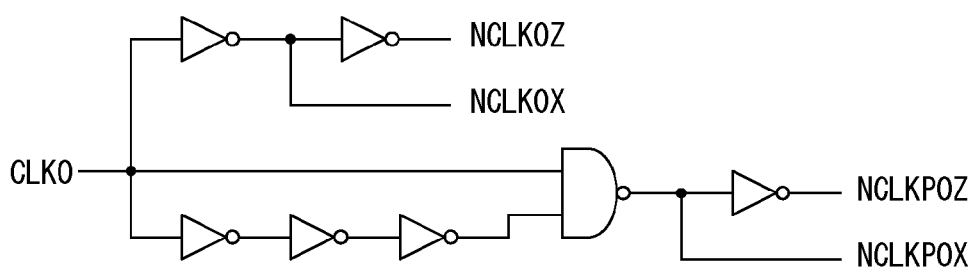
Figure 8C:
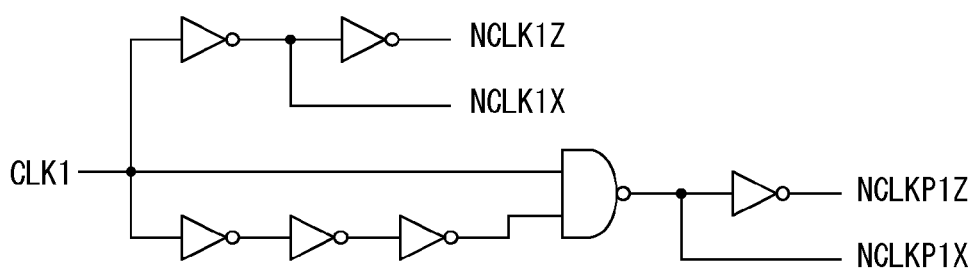

FIGS. 8A to 8C are diagrams illustrating concrete constitutional examples of 2CLK-FF.

In circuits of FIGS. 8B and 8C, one-shot pulses NCLKP0Z and NCLKP0X, and NCLKP1Z and NCLKP1X are generated from CLK0 and CLK1. Since these one-shot pulse generation circuits are known, explanations regarding these circuits are omitted. In the circuits of FIGS. 8B and 8C, clocks NCLK0Z, NCLK0X, NCLK1Z and NCLK1X are further generated.

A circuit of FIG. 8A latches DATA0 in synchronization with clock NCLK0Z and NCLK0X, and latches DATA1 in synchronization with clock NCLK1Z and NCLK1X. Further, the circuit of FIG. 8A alternately latches the latched data by latch circuits of later stages in synchronization with one-shot pulses NCLKP0Z and NCLKP0X and one-shot pulses NCLKP1Z and NCLKP1X, and outputs the latched data by the later stage as output data Q. Since a person with ordinary skill in the art can easily understand the constitutions and operations of these 2-stages latch circuits, explanations regarding these circuits are omitted.

Figure 9:
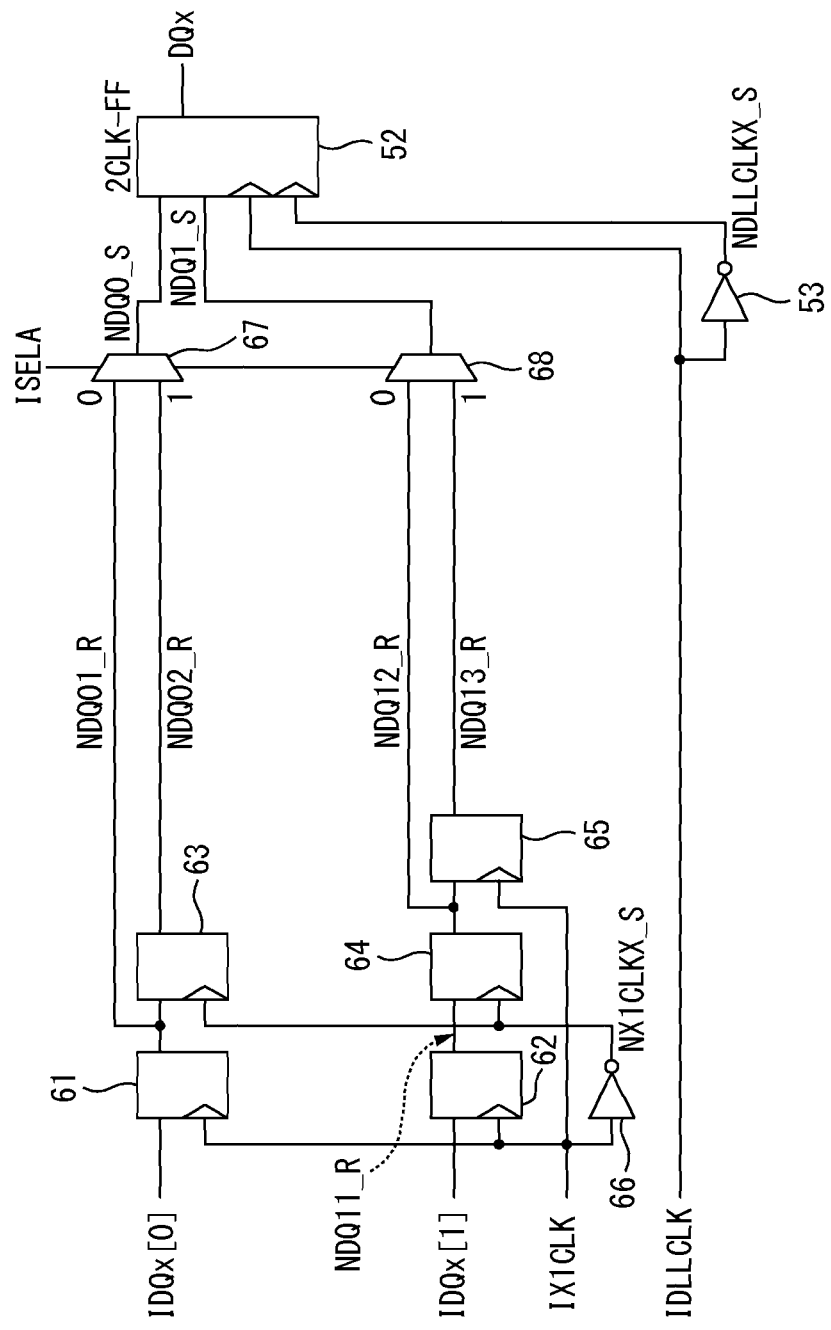
FIG. 9 is a circuit diagram illustrating a constitution of one of the bit-slice circuits.

FIG. 9 is a circuit diagram illustrating a constitution of one of the bit-slice circuits.

Figure 10:
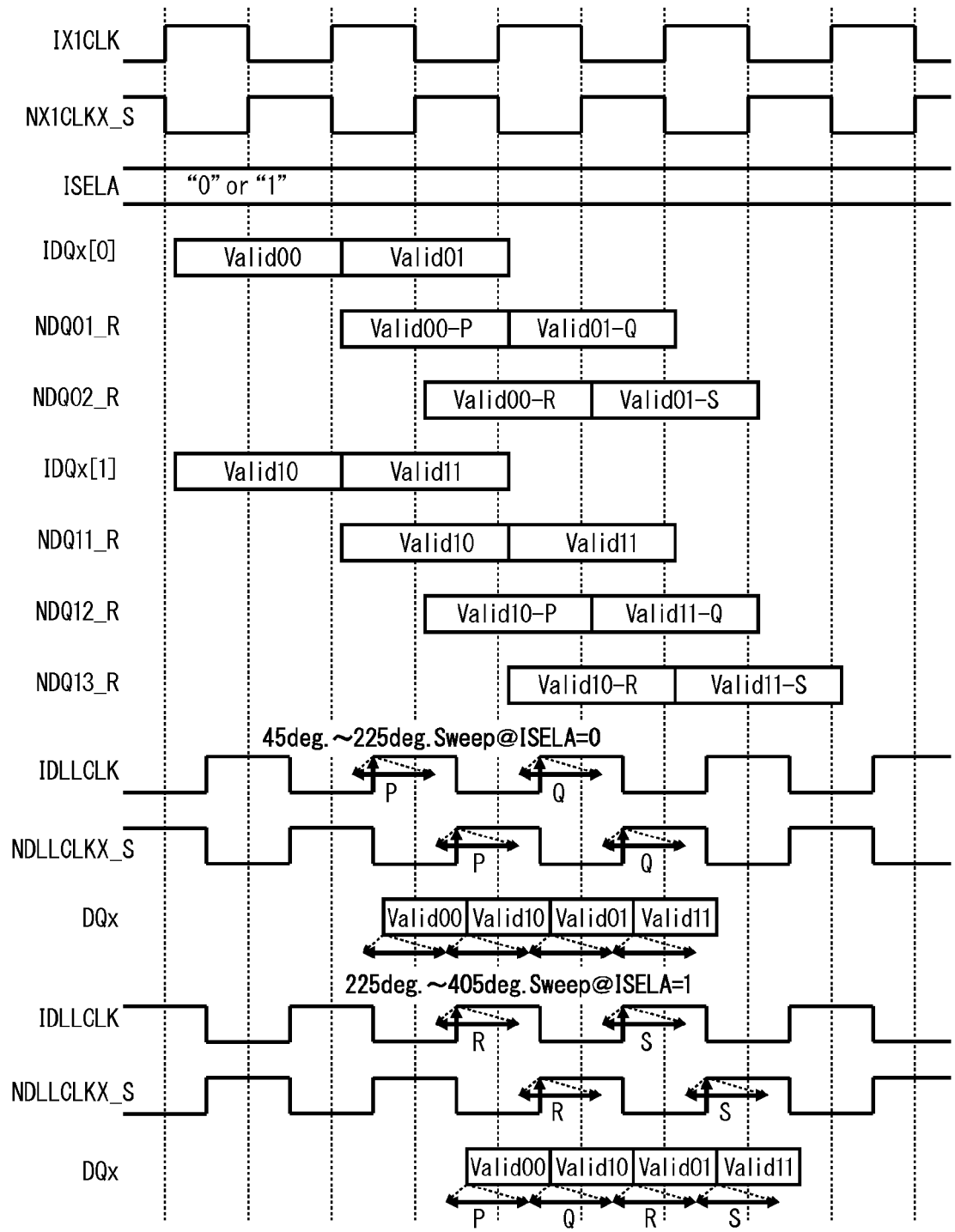
FIG. 10 is a time chart illustrating operations of the bit-slice circuit.

FIG. 10 is a time chart illustrating operations of the bit-slice circuit.

The bit-slice circuit includes: five FFs 61-65 which are connected as illustrated in FIG. 9; an inverter 66 inverting X1CLK (IX1CLK) and outputting NX1CLK_S; two selectors 67 and 68; 2CLK-FF 52; and an inverter 53. 2CLK-FF 52 corresponds to one of 2CLK-FFs 52A-52C. The inverter 53 corresponds to one of inverters 53A-53C. The selectors 67 and 68 carry out selection operations according to a latency adjustment signal ISELA from the control signal generation circuit 42.

FF 61 latches IDQx[0], which is one of the 2-bits input data, in synchronization with IX1CLK and outputs the latched data as NDQ01_R. FF 62 latches IDQx[1], which is the other of the 2-bits input data, in synchronization with NX1CLK_S and outputs the latched data as NDQ011_R.

FF 63 latches NDQ01_R in synchronization with NX1CLK_S and outputs the latched data as NDQ02_R. FF 64 latches NDQ11_R in synchronization with NX1CLK_S and outputs the latched data as NDQ12_R. NDQ02_R corresponds to NDQ01_R delayed by a half cycle of X1CLK, and NDQ12_R corresponds to NDQ11_R delayed by a half cycle of X1CLK. FF 65 latches NDQ12_R in synchronization with IX1CLK_S and outputs the latched data as NDQ13_R. NDQ13_R corresponds to NDQ12_R further delayed by a half cycle of X1CLK.

IDLLCLK is a clock of which phase is adjusted by DLL_A 43 and DLL_Zs 44A-44C. Inverter 53 generates NDLLCLK_S by inverting IDLLCLK.

The selector 67 selects NDQ01_R when the latency control signal ISELA=0, selects NDQ02_R when the latency control signal ISELA=1, and outputs the selected data as NDQ0_S. The selector 68 selects NDQ12_R when the latency control signal ISELA=0, selects NDQ13_R when the latency control signal ISELA=1, and outputs the selected data as NDQ1_S.

2CLK-FF52 latches NDQ0_S in synchronization with IDLLCLK, latches NDQ1_S in synchronization with NDLLCLK_S, and outputs the latched data to DQx as serial data.

As described above, IDLLCLK is the clock of which phase is adjusted by DLL_A 43 and DLL_Z. When IDLLCLK is swept, DQx is also swept.

A range of IDLLCLK swept by DLL_A 43 is 45 deg.-405 deg.@Ref.CLK. When the adjusted phase resides in 45 deg.-225 deg.@Ref.CLK, ISELA is set to zero (ISELA=0). When the adjusted phase resides in 225 deg.-405 deg.@Ref.CLK, ISELA is set to 1 (ISELA=1). The latency control signal ISELA is a common signal among bits.

In FIG. 10, "P" designates sweeping ranges of IDLLCLK and NDLLCLK_S corresponding to data Valid00 at a front side of IDQx[0] when ISELA=0. Similarly, "Q" designates sweeping ranges of IDLLCLK and NDLLCLK_S corresponding to data Valid01 at a rear side of IDQx[0] when ISELA=0. "R" designates sweeping ranges of IDLLCLK and NDLLCLK_S corresponding to data Valid10 at a front side of IDQx[1] when ISELA=1. Similarly, "S" designates sweeping ranges of IDLLCLK and NDLLCLK_S corresponding to data Valid10 at a rear side of IDQx[1] when ISELA=1.

Figure 11A:
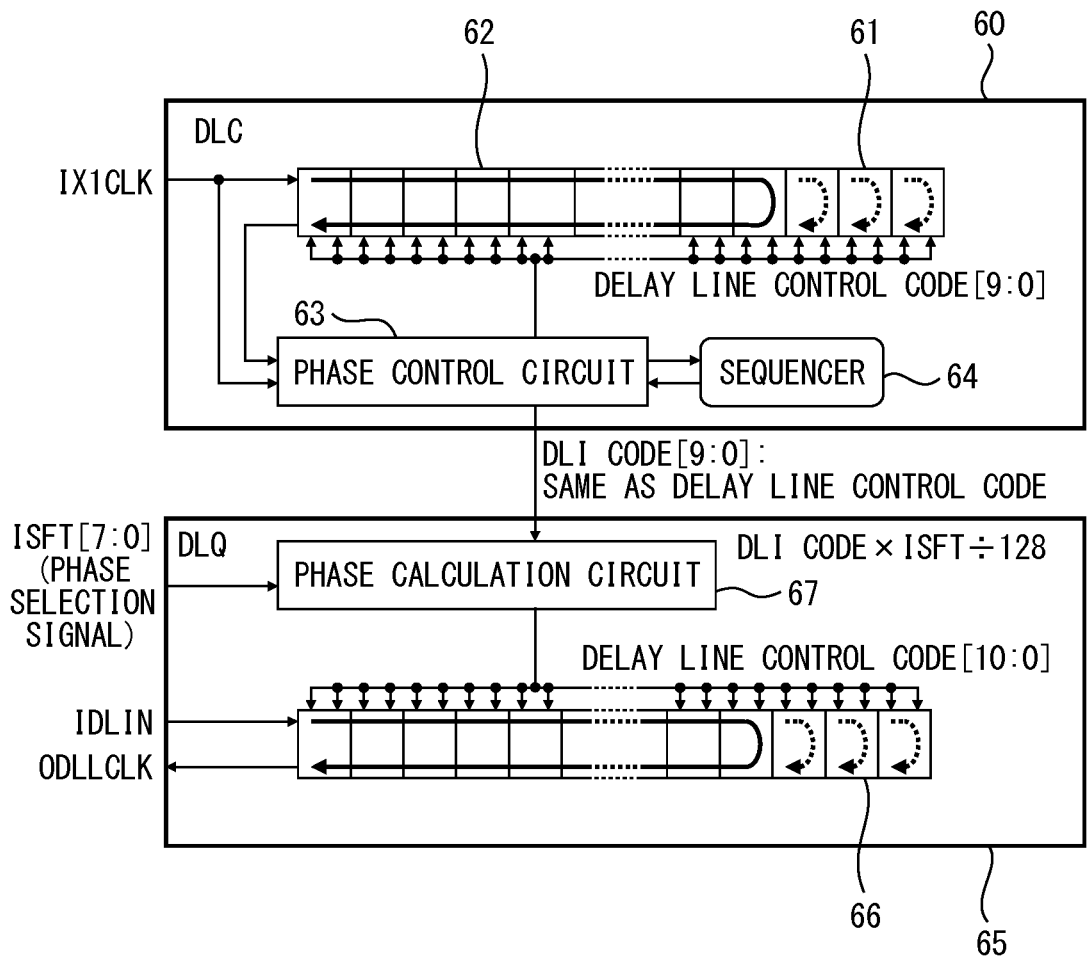
FIG. 11A is a diagram illustrating a total constitution of an example of DLL (Delay Locked Loop) forming DLL_A and DLL_Zs.
Figure 11B:
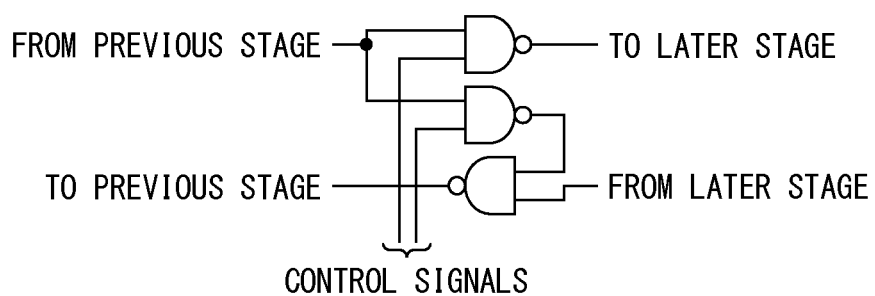
FIG. 11B is a circuit diagram illustrating a delay unit used in the DLL.

FIG. 11A is a diagram illustrating a total constitution of an example of DLL (Delay Locked Loop) forming DLL_A 43 and DLL_Zs 44A-44C. FIG. 11B is a circuit diagram illustrating a delay unit used in the DLL.

The DLL includes DLC 60 and DLQ 65. DLC 60 includes: a delay line 61; a phase control circuit 63: and a sequencer 64. The delay line 61 is formed by serially connecting a plurality of delay units of FIG. 11B in a plurality of stages (here, 1024 stages). In the delay line 61, a position of a delay unit at which an input IX1CLK returns is controlled by a delay line control code of 10 bits. Each of the delay units 62 delays a signal which proceeds from a prior stage to a later stage, a time of the delay is equal to a pass time through a NAND gate. Similarly, each of the delay units 62 delays a signal which returns from the later stage to the prior stage, a time of the delay is equal to the pass time through a NAND gate. When a number of delay units 62 from the first stage to the returning position is J, IX1CLK input to the delay line 61 passes a number of NAND gates of 2*J in a path proceeding to the returning position and returning from the returning position to the first stage. Accordingly, when a delay time of the NAND gate is τ, a delayed IX1CLK which is input to the first stage and output from the first stage is delayed by 2*J*τ. As described above, the returning point, namely J is controlled by the delay line control code.

The phase control circuit 63 compares a phase of the delayed IX1CLK with a phase of IXCLK according to a control sequence by the sequencer 64, and adjusts a value of the delay line control code so that the delayed IX1CLK is delayed with respect to IXCLK by one cycle of IXCLK. Concretely, the adjustment is carried out so that a phase difference between IXCLK and the delayed IX1CLK is zero.

It is known that the value of the delay line control code of when the phase difference is zero, namely, the delay 2*J*τ due to a number of J of delay units from the first stage to the returning point is same as a time of one cycle of IXCLK. The phase control circuit 63 outputs the value of the delay line control code of when the phase difference is zero to DLQ65 as DLI code[9:0].

DLQ 65 includes; a delay line 66; and a phase calculation circuit 67. As similar to the delay line 61 of DLC60, the delay line 66 is formed by delay units 62 having the same constitution as that of the delay line 61, a number of stages (a number of delay units) is 1152. Accordingly, a delay of the delay line 66 is same as that of the delay line 61. Clock IDLIN, which is to be delayed, is input to the delay line 66, and is output as ODLLCLK after being delayed in the delay line 66.

The phase calculation circuit 67 receives a phase selection signal ISFT[7:0] of 8-bits designating a phase adjustment angle, and generates a delay line control code[10:0] of 11-bits by multiply the above-mentioned DLI code[9:0] by ISFT[7:0] and further dividing by 128. The delay line 66 delays IDLIN by a delay of going back and forth between the first stage and the returning point which is designated by the delay line control code[10:0], and outputs the delayed IDLIN as ODLLCLK.

For example, when DLI code[9:0] output from DLC 60 is 512 and ISFT[7:0] is 64 corresponding to 45 deg., the delay line control code[10:0] is 256.

DLL used in the embodiments is not limited to that illustrated in FIG. 11A and FIG. 11B, and various types of DLL may be used. Since various constitutions of DLL are well known, further explanations regarding DLL are omitted.

FIG. 12 is a diagram illustrating a truth table of ISFT[7:0] and the latency adjustment signal ISELA used in the output circuit of the first embodiment. FIG. 12 illustrates NDQ0_S and NDQ1_S output from the selectors 67 and 68 and values of phase adjustment corresponding to ISFT.

For example, when ISFT[7:0]=01001101, ISELA=0, NDQ01_R and NDQ12_R are selected as NDQ0_S and NDQ1_S, and the phase is 216.5625 deg.

As described above, in the output circuit of the first embodiment, the conversion of 2-bits parallel data to 1-bit serial data is carried out by 2CLK-FF. The latency expansion circuit operates in synchronization with the reference clock and the inverted reference clock. 2CLK-FF operates in synchronization with the phase adjusted reference clock and the inverted clock thereof. Accordingly, the power consumption of 2CLK-FF is small and the circuitry operational margin of 2CLK-FF is large in comparison with a circuit operating by a high-speed clock having a double frequency. Further, DLLs for individual bits are arranged on paths of CLK supplied to 2CLK-FFs of the last stages and near the common DLL among bits. Therefore, the circuit area is reduced since lines of control signals used in individual DLLs are not arranged in respective paths to 2CLK-FFs.

In the first embodiment, the phase adjustment range of the DLL_A common among bits is large as 45 deg.-405 deg. In order to make the phase adjustment range of the DLL_A to be large, a number of stages of DLQ 65 of FIG. 11 is increased. Therefore, the circuit area thereof becomes large. In a second embodiment which is described next, an output circuit of which a phase adjustment range of DLL_A is reduced is described.

Figure 13:
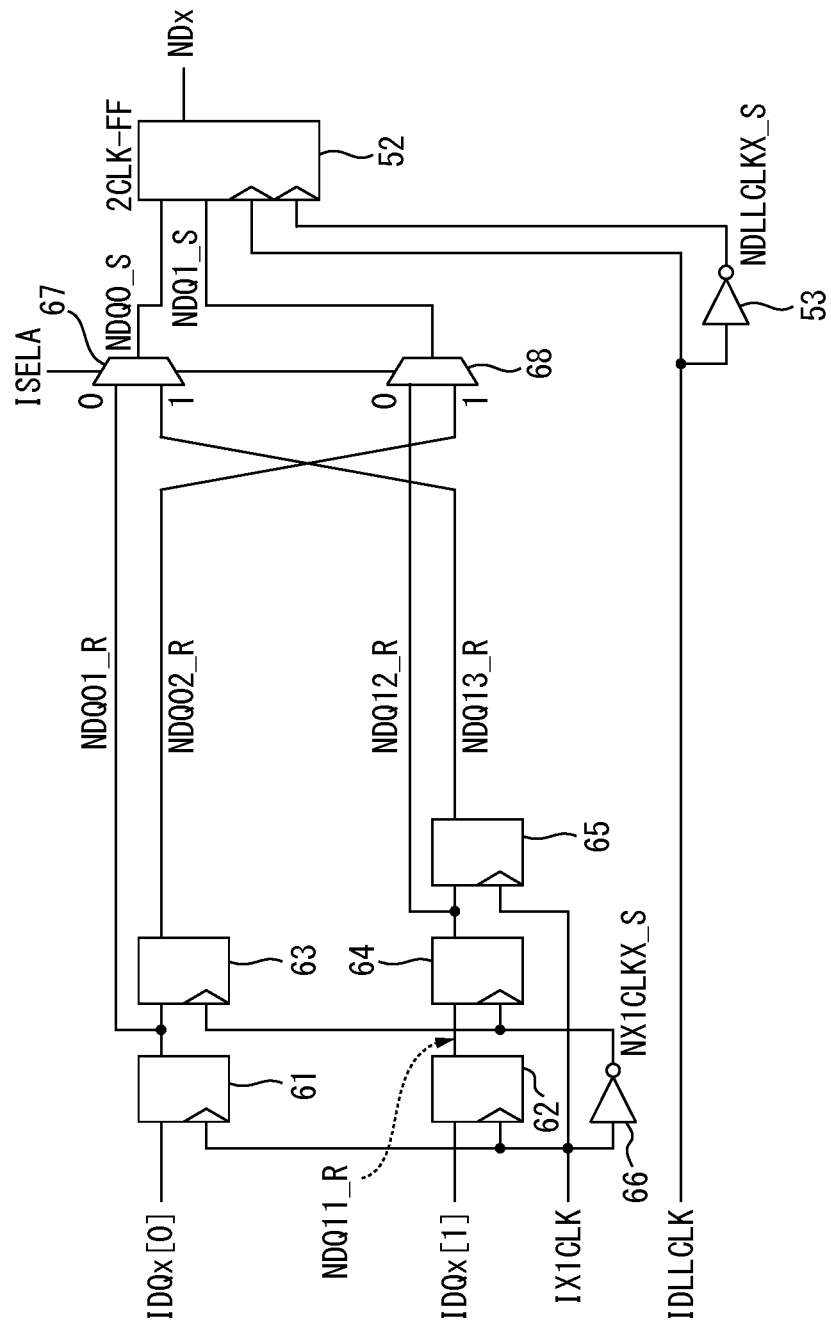
FIG. 13 is a circuit diagram illustrating a constitution of one of bit-slice circuits in an output circuit of a second embodiment.

FIG. 13 is a circuit diagram illustrating a constitution of one of bit-slice circuits in an output circuit of a second embodiment.

The output circuit of the second embodiment differs from the output circuit of the first embodiment in that NDQ01_R and NDQ13_R are input to the selector 67, and NDQ12_R and NDQ02_R are input to the selector 68. Other portions of the output circuit of the second embodiment are same as those of the output circuit of the first embodiment.

Figure 14:
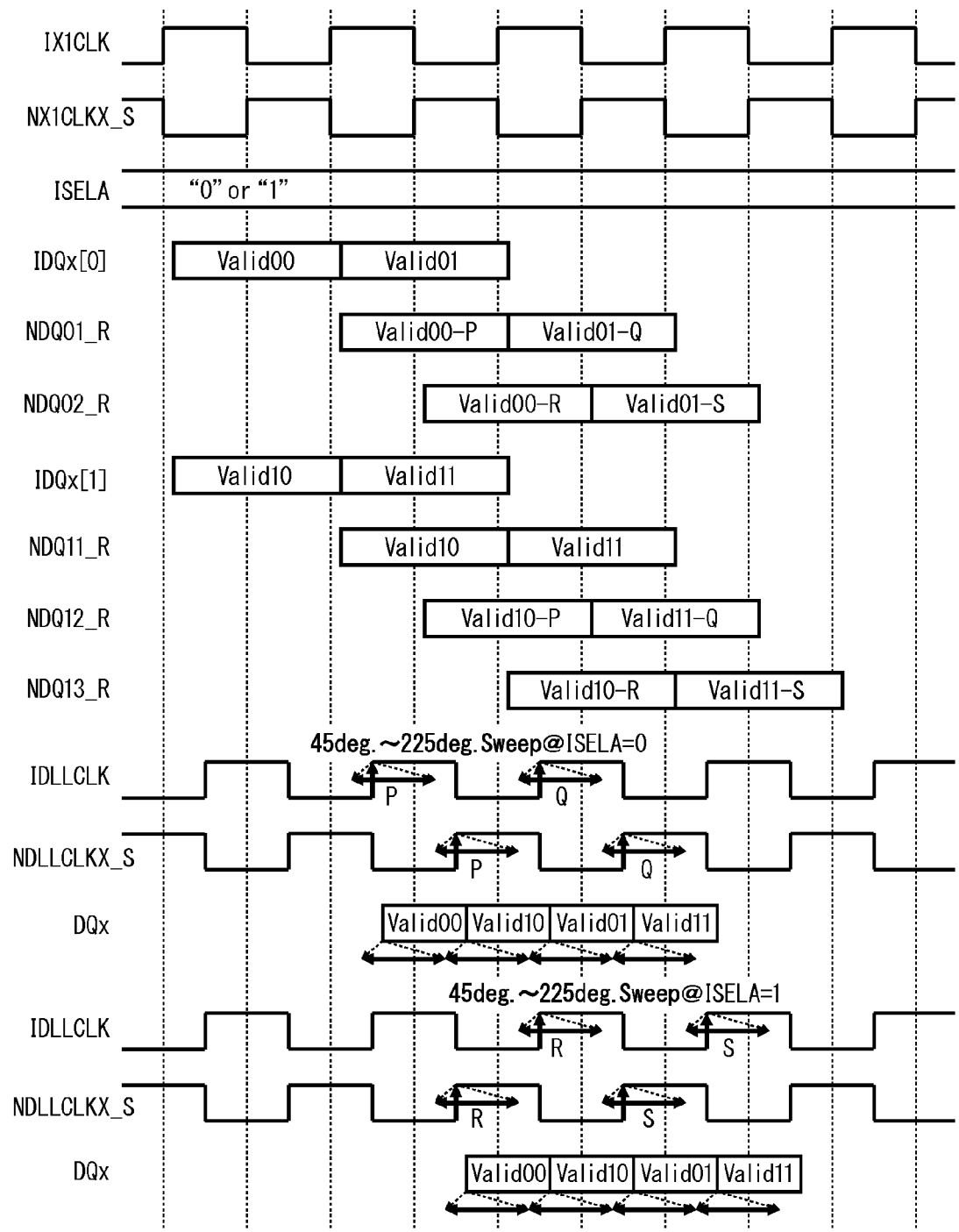
FIG. 14 is a time chart illustrating operations of the bit-slice circuit of the second embodiment.

FIG. 14 is a time chart illustrating operations of the bit-slice circuit of the second embodiment.

A phase adjustment range of DLL_A is outwardly expanded by alternating the selector 67 and the selector to which NDQ02_R and NDQ13_R are input. The phase adjustment range of DLL_A is changed from the range of 45 deg.-405 deg. in the first embodiment to a range of 45 deg.-225 deg. in the second embodiment. By this, the circuit area is reduced. Concretely, although a number of stages of DLQ 65 of DLL in FIG. 11A is 1152 in the first embodiment, it is reduced to 640 in the second embodiment. In the second embodiment, ISELA is also a common signal among bits.

As illustrated in FIGS. 13 and 14, when ISELA=0, 2CLK-FF 52 latches NDQ01_R in synchronization with a rising edge of CLK0 (IDLLCLK), latches NDQ12_R in synchronization with a rising edge of CLK1 (NDLLCLK_S), and outputs the latched signal to DQx.

When ISELA=1, 2CLK-FF 52 latches NDQ13_R in synchronization with the rising edge of CLK1 (NDLLCLK_S), latches NDQ02_R in synchronization with the rising edge of CLK0 (IDLLCLK), and outputs the latched signal to DQx.

In a state of ISELA=0, IDLLCLK is swept from 45 deg. to 225 deg., and the state is switched to ISELA=1 when IDLLCLK reaches 225 deg. Further, IDLLCLK is swept from 45 deg. to 225 deg., and the state is switched to ISELA=0 when IDLLCLK reaches 225 deg.

As described above, the output circuit of the second embodiment obtains the same effects as those of the first embodiment. Further, since the sweeping range of CLK input to 2CLK-FF at the last stage is 45 deg.-225 deg., a number of stages of DLL_A is reduced, and an area thereof is reduced.

In the second embodiment, conditions regarding a part of allowed ranges (windows) of set-up time/hold time in 2CLK-FF 52 becomes strict. Concretely, when a position in the sweeping range of DLL_A is minimum, the set-up margin is a value corresponding to a phase of 45 deg. of X1CLK, therefore, the set-up time is 117 pico-seconds when a frequency of X1CLK is 1.066 GHz. Further, when a position in the sweeping range of DLL_A is maximum, a phase of X1CLK is a sum of 225 deg. (a common delay among bits at DLL_A common) and 90 deg. (individual delays at DLL_Zs) (225 deg.+90 deg.), and the hold margin is therefore 360 deg.−(225 deg.+90 deg.)=45 deg. Therefore, the hold time is also 117 pico-seconds. Thus, the condition regarding the set-up time/hold time becomes strict when the sweeping position is minimum and maximum.

In an output circuit of a third embodiment which is described next, the condition regarding the set-up time/hold time in 2CLK-FF 52 which becomes strict in the second embodiment is relaxed.

Figure 15:
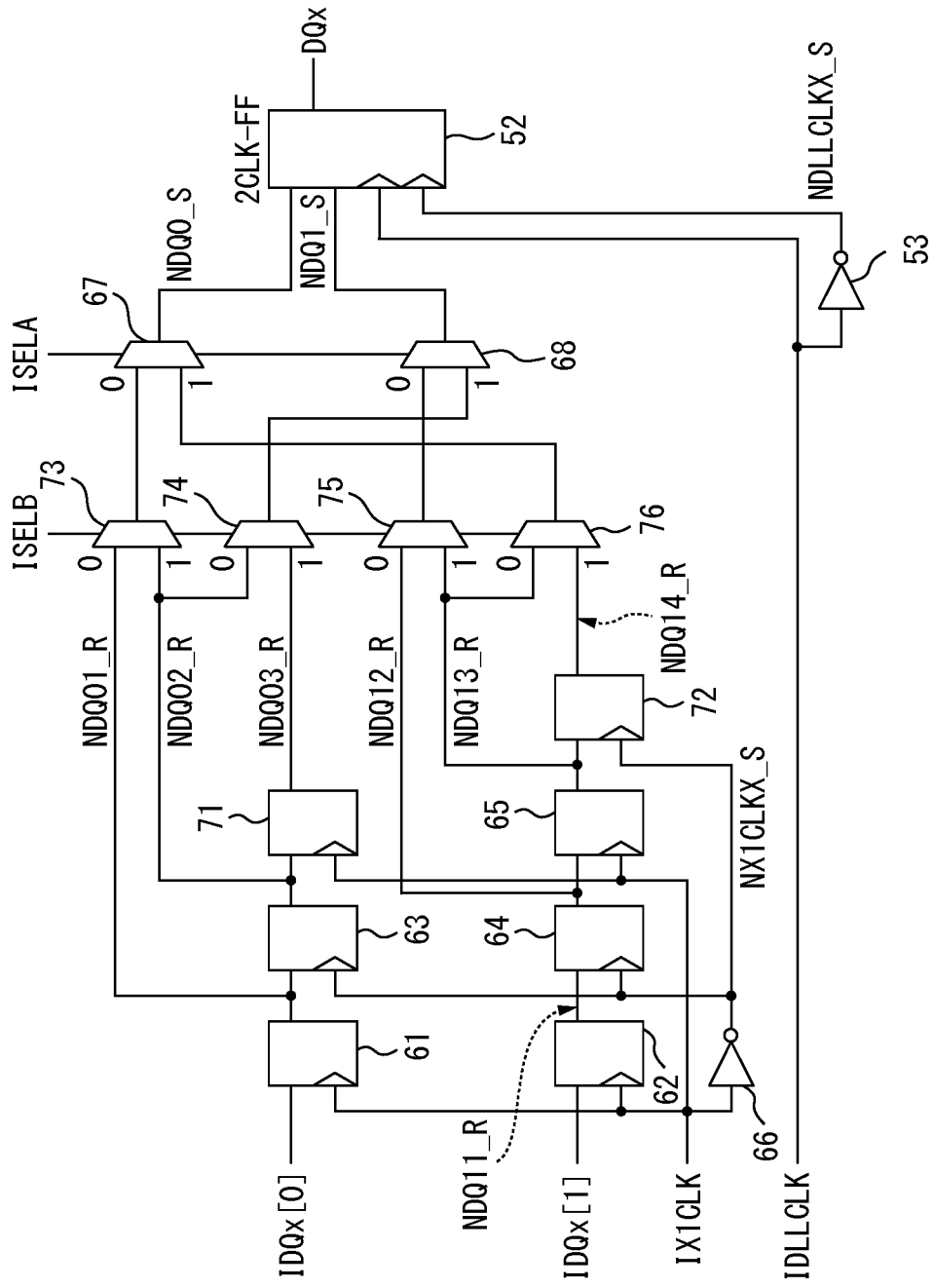
FIG. 15 is a circuit diagram illustrating a constitution of one of bit-slice circuits in an output circuit of a third embodiment.

FIG. 15 is a circuit diagram illustrating a constitution of one of bit-slice circuits in an output circuit of a third embodiment.

The output circuit of the third embodiment differs from the output circuit of the second embodiment in that FF 71, FF 72 and selectors 73-76 are added in the bit-slice circuit. Other portions of the output circuit of the third embodiment are same as those of the output circuit of the second embodiment. In the third embodiment, the control signal generation circuit generates an expansion latency control signal ISELB according to a phase adjustment value of DLL_Z.

FF 71 latches an output from FF 63 in synchronization with IX1CLK. NDQ03_R output from FF 71 is a signal corresponding to NDQ01_R being delayed by one cycle of IX1CLK. In other words, NDQ03_R is a signal corresponding to NDQ02_R being delayed by a half cycle of IX1CLK.

FF 72 latches an output from FF 65 in synchronization with NX1CLK_S. NDQ14_R output from FF 72 is a signal corresponding to NDQ12_R being delayed by one cycle of IX1CLK. In other words, NDQ14_R is a signal corresponding to NDQ13_R being delayed by a half cycle of IX1CLK.

The selector 73 receives NDQ01_R and NDQ02_R, selects and outputs NDQ01_R when the expansion latency control signal ISELB=0, and selects and outputs NDQ02_R when ISELB=1.

The selector 74 receives NDQ02_R and NDQ03_R, selects and outputs NDQ02_R when the expansion latency control signal ISELB=0, and selects and outputs NDQ03_R when ISELB=1.

The selector 75 receives NDQ12_R and NDQ13_R, selects and outputs NDQ12_R when the expansion latency control signal ISELB=0, and selects and outputs NDQ13_R when ISELB=1.

The selector 76 receives NDQ13_R and NDQ14_R, selects and outputs NDQ13_R when the expansion latency control signal ISELB=0, and selects and outputs NDQ14_R when ISELB=1.

The selector 67 receives outputs from the selector 73 and the selector 76, selects the output from the selector 73 when the latency control signal ISELA=0, selects the output from the selector 76 when ISELA=1, and outputs the selected one as NDQ0_S.

The selector 68 receives outputs from the selector 75 and the selector 74, selects the output from the selector 75 when the latency control signal ISELA=0, selects the output from the selector 74 when ISELA=1, and outputs the selected data as NDQ1_S.

FIG. 16 is a diagram illustrating a truth table representing relationships of the latency control signal corresponding to phase ranges and the selected signal.

As illustrated in the truth table of FIG. 16, in the third embodiment, four conditions of No. 1-No. 4 exist, the No. 1 condition is same as the condition of ISELA=0 in the second embodiment, the No. 3 condition is same as the condition of ISELA=1 in the second embodiment. In other words, in the third embodiment, No. 2 and No. 4 conditions of ISELB=1 are added.

No. 2 condition has a range in which a sum of the common phase adjustment value of DLL_A 43 and each phase adjustment value of DLL_Zs 44A-44C is 225 deg.-315 deg. In the No. 2 condition, ISELA=0 and ISELB=1. In the No. 2 condition, NDQ02_R is selected as NDQ0_S, and NDQ14_R is selected as NDQ1_S.

No. 4 condition has a range in which a sum of the common phase adjustment value of DLL_A 43 and each phase adjustment value of DLL_Zs 44A-44C is 225 deg.-315 deg. In the No. 2 condition, ISELA=1 and ISELB=1. In the No. 4 condition, NDQ13_R is selected as NDQ0_S, and NDQ03_R is selected as NDQ1_S.

Figure 17:
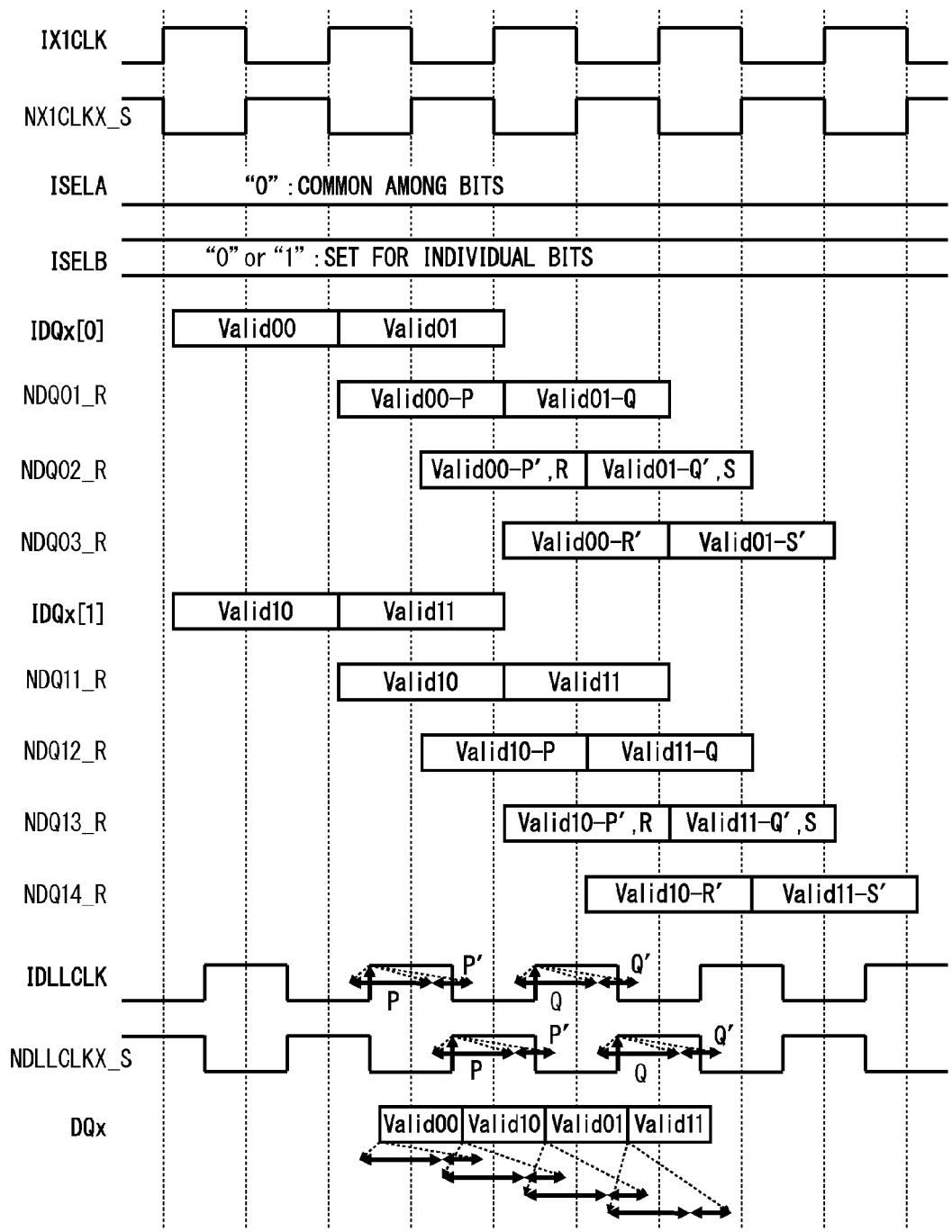
FIG. 17 is a time chart illustrating operations of the bit-slice circuit when ISELA=0 in the third embodiment.

FIG. 17 is a time chart illustrating operations of the bit-slice circuit when ISELA=0 in the third embodiment.

Figure 18:
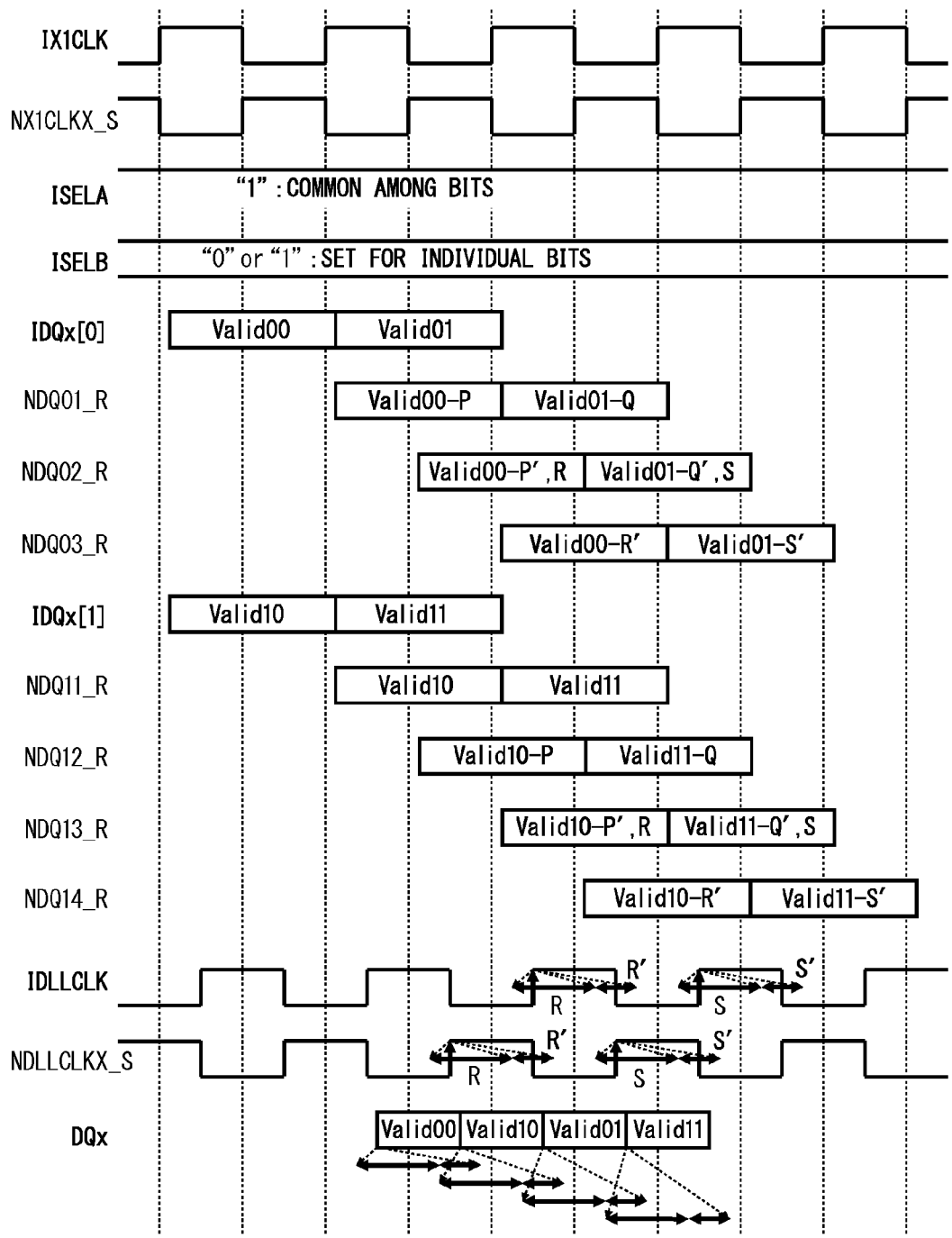
FIG. 18 is a time chart illustrating operations of the bit-slice circuit when ISELA=1 in the third embodiment.

FIG. 18 is a time chart illustrating operations of the bit-slice circuit when ISELA=1 in the third embodiment.

In the following, the setting operation of the latency control signal ISELA, the expansion latency control signal ISELB and phase adjustment value in a training mode, and normal operations are described.

In the training mode, a common phase among bits is determined by sweeping a phase of DLL_A 43 in a range of 45 deg.-225 deg. Then, respective phases of respective bits are determined by respectively sweeping phases of DLL_Z 44A-44C in a range of 0 deg.-90 deg. In the sweeping, ISELB is set to 0 (ISELB=0) when a sum of a phase of DLL_A and a phase of DLL_Z is less than 225 deg., and ISELB is set to 1 (ISELB=1) when the sum is equal to or larger than 225 deg. When ISELB=1, data input to 2CLK-FF 52 is delayed by a half cycle of X1CLK to increase the hold margin at 2CLK-FF 52. Since ISELBs are selector signals (expansion latency signals) determined according to respective conditions of DLL_Zs (+DLL_A) for respective bits, ISELBs are respectively determined for respective bits. Since ISELA is a selection signal for expanding a phase adjustment range of DLL_A common among bits, ISELA is a signal common among bits as the second embodiment.

The output circuit of the third embodiment has the same effects as those of the first and second embodiments. Further, the problem in the second embodiment that the margins of set-up time/hold time of 2CLK-FF are small is solved, and the margins are easily obtained.

The first to third embodiments are described above. The effects of the output circuits of the first to third embodiments are illustrated in the following.

(1) When a bit rate of data transmission is 2.133 Gbp, outputs changes in one cycle of clock of 2.133 GHz. However, according to the embodiments, a frequency of a control clock of an output circuit is 1.066 GHz, and a speed of the control clock is reduced to a speed corresponding to a half of the transmission rate. Therefore, power consumption is reduced and circuitry operational margins are also improved.

(2) Since a range for receiving data is expanded according to a control phase when sweeping CLK input to 2CLK-FF at the last stage, the circuitry operational margins are obtained sufficiently.

(3) Since DLLs for respective bits are arranged on paths of CLK supplied to 2CLK-FFs of the last stages and near the common DLL among bits, signals lines are shortened, and the circuit area is reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An output circuit comprising:
   an output portion which includes a plurality of output blocks each of which converts 2-bits parallel data to 1-bit serial data and outputs the converted serial data;
   a control signal generation circuit which generates a latency adjustment signal, a first phase adjustment signal and a plurality of second phase adjustment signals according to a reference clock;
   a first clock generation portion which generates a first clock according to the reference clock based on the first phase adjustment signal; and
   a plurality of second clock generation portions which individually generate second clocks in synchronization with the first clock and inverted second clocks, which are inverted of the second clocks, individually based on the plurality of second phase adjustment signals, wherein
   each of the plurality of output blocks includes:
   a latency expansion circuit which sequentially latches the 2-bits parallel data according to the reference clock and an inverted reference clock, which is inverted of the reference clock, selects two from the latched data signals based on the latency adjustment signal, and outputs the selected two; and
   a two-clocks flip-flop circuit which is arranged with respect to the latency expansion circuit, which latches one of two outputs from the latency expansion circuit in synchronization with the second clock corresponding to the output block and holds the output for a half of a cycle of the second clock, and which latches the other of the two outputs from the latency expansion circuit in synchronization with the inverted second clock corresponding to the output block and holds the output for a half of a cycle of the inverted second clock.

2. The output circuit according to claim 1, wherein
   the latency expansion circuit comprises:
   a first delay circuit which includes a latch circuit configured to input one of the 2-bits parallel data and has two-stages, a first stage of which latches one of the 2-bits parallel data in synchronization with the reference clock, and a second stage of which latches an output of the first stage in synchronization with the inverted reference clock;
   a second delay circuit which includes a latch circuit configured to input the other of the 2-bits parallel data and has three-stages, a first stage of which latches the other of the 2-bits parallel data in synchronization with the reference clock, a second stage of which latches an output of the first stage of the second delay circuit in synchronization with the inverted reference clock, a third stage of which latches an output of the second stage of the second delay circuit in synchronization with the reference clock;
   a first selection circuit which selects one of an output from the first stage of the first delay circuit and an output from the second stage of the first delay circuit based on the latency adjustment signal; and
   a second selection circuit which selects one of the output from the second stage of the second delay circuit and an output from the third stage of the second delay circuit based on the latency adjustment signal,
   the two-clocks flip-flop circuit latches an output from the first selection circuit in synchronization with the second clock, outputs the latched one for a half of the cycle of the second clock, and
   the two-clocks flip-flop circuit latches an output from the second selection circuit in synchronization with the inverted second clock, outputs the latched one for a half of the cycle of the inverted second clock.

3. The output circuit according to claim 1, wherein
   the latency expansion circuit comprises:
   a first delay circuit which includes a latch circuit configured to input one of the 2-bits parallel data and has two-stages, a first stage of which latches one of the 2-bits parallel data in synchronization with the reference clock, a second stage of which latches an output of the first stage in synchronization with the inverted reference clock;

a second delay circuit which includes a latch circuit configured to input the other of the 2-bits parallel data and has three-stages, a first stage of which latches the other of the 2-bits parallel data in synchronization with the reference clock, a second stage of which latches an output of the first stage of the second delay circuit in synchronization with the inverted reference clock, a third stage of which latches an output of the second stage of the second delay circuit in synchronization with the reference clock;

a first selection circuit which selects one of the output from the first stage of the first delay circuit and an output from the third stage of the second delay circuit based on the latency adjustment signal; and a second selection circuit which selects one of the output from the second stage of the second delay circuit and an output from the second stage of the first delay circuit based on the latency adjustment signal, the two-clocks flip-flop circuit latches an output from the first selection circuit in synchronization with the second clock, outputs the latched one for a half of the cycle of the second clock, and the two-clocks flip-flop circuit latches an output from the second selection circuit in synchronization with the inverted second clock, outputs the latched one for a half of the cycle of the inverted second clock.

4. The output circuit according to claim 3, wherein the latency expansion circuit comprises:

a first cycle delay latch circuit which latches the output from the second stage of the first delay circuit in synchronization with the reference clock;

a second cycle delay latch circuit which latches the output from the third stage of the second delay circuit in synchronization with the inverted reference clock;

a third selection circuit which selects one of the outputs from the first stage and the second stage of the first delay circuit based on the latency adjustment signal;

a fourth selection circuit which selects one of the output from the second stage of the first delay circuit and an output from the first cycle delay latch circuit based on the latency adjustment signal;

a fifth selection circuit which selects one of the outputs from the second stage and the third stage of the second delay circuit based on the latency adjustment signal, and a sixth selection circuit which selects one of the output from the third stage of the second delay circuit and an output from the second cycle delay latch circuit based on the latency adjustment signal, the first selection circuit selects one of an output from the third selection circuit and an output from the sixth selection circuit based on the latency adjustment signal, and the second selection circuit selects one of an output from the fifth selection circuit and an output from the fourth selection circuit based on the latency adjustment signal.

5. The output circuit according to claim 1, wherein the first clock generation portion comprises a first DLL circuit delaying the reference clock by a first phase value based on the first phase adjustment signal to generate the first clock, and the second clock generation portion comprises a second DLL circuit delaying the first clock, which is output from the first DLL circuit, by a second phase value based on the second phase adjustment signal to generate the second clock.

6. The output circuit according to claim 2, wherein the first clock generation portion comprises a first DLL circuit delaying the reference clock by a first phase value based on the first phase adjustment signal to generate the first clock, and the second clock generation portion comprises a second DLL circuit delaying the first clock, which is output from the first DLL circuit, by a second phase value based on the second phase adjustment signal to generate the second clock.

7. The output circuit according to claim 3, wherein the first clock generation portion comprises a first DLL circuit delaying the reference clock by a first phase value based on the first phase adjustment signal to generate the first clock, and the second clock generation portion comprises a second DLL circuit delaying the first clock, which is output from the first DLL circuit, by a second phase value based on the second phase adjustment signal to generate the second clock.

8. The output circuit according to claim 4, wherein the first clock generation portion comprises a first DLL circuit delaying the reference clock by a first phase value based on the first phase adjustment signal to generate the first clock, and the second clock generation portion comprises a second DLL circuit delaying the first clock, which is output from the first DLL circuit, by a second phase value based on the second phase adjustment signal to generate the second clock.

9. The output circuit according to claim 5, wherein the control signal generation portion generates the latency adjustment signal based on the first phase value.

10. The output circuit according to claim 6, wherein the control signal generation portion generates the latency adjustment signal based on the first phase value.

11. The output circuit according to claim 7, wherein the control signal generation portion generates the latency adjustment signal based on the first phase value.

12. The output circuit according to claim 8, wherein the control signal generation portion generates the latency adjustment signal based on the first phase value.

13. The output circuit according to claim 5, wherein the control signal generation portion generates each of the latency adjustment signals corresponding to each of the plurality of the output blocks based on each result obtained by adding the first phase value and each of the second phase values of the plurality of second clock generation portions.

14. The output circuit according to claim 6, wherein the control signal generation portion generates each of the latency adjustment signals corresponding to each of the plurality of the output blocks based on each result obtained by adding the first phase value and each of the second phase values of the plurality of second clock generation portions.

15. The output circuit according to claim 7, wherein the control signal generation portion generates each of the latency adjustment signals corresponding to each of the plurality of the output blocks based on each result obtained by adding the first phase value and each of the second phase values of the plurality of second clock generation portions.

16. The output circuit according to claim 8, wherein the control signal generation portion generates each of the latency adjustment signals corresponding to each of the plurality of the output blocks based on each result obtained by adding the first phase value and each of the second phase values of the plurality of second clock generation portions.

\* \* \* \* \*